(12) United States Patent
Davis, Jr. et al.

(10) Patent No.: US 6,550,835 B2
(45) Date of Patent: Apr. 22, 2003

(54) METHOD AND APPARATUS FOR SUPPORTING AN ELECTRICAL CIRCUIT BOARD IN A VEHICLE PANEL CLOSURE

(75) Inventors: Joseph J. Davis, Jr., Ortonville, MI (US); Timothy F. O'Brien, White Lake, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 09/863,716

(22) Filed: May 23, 2001

(65) Prior Publication Data

US 2002/0175533 A1 Nov. 28, 2002

(51) Int. Cl.[7] .............................. B60N 3/12; B60R 7/06
(52) U.S. Cl. ........................................ 296/37.12; 296/70
(58) Field of Search .................. 296/901, 37.12, 296/70; 180/90

(56) References Cited

U.S. PATENT DOCUMENTS

| | | | |
|---|---|---|---|
| 3,088,539 A | * | 5/1963 | Mathues et al. |
| 4,768,286 A | | 9/1988 | Ketcham |
| 4,893,833 A | * | 1/1990 | DiSalvo et al. |
| 5,190,314 A | * | 3/1993 | Takasugi |
| 5,473,125 A | | 12/1995 | Stief et al. |
| 5,700,697 A | | 12/1997 | Dlugokecki |
| 5,705,104 A | | 1/1998 | Trublowski et al. |
| 5,712,764 A | * | 1/1998 | Baker et al. |
| 5,733,639 A | | 3/1998 | Gosselin |
| 5,883,777 A | * | 3/1999 | Nishitani et al. |
| 5,934,733 A | | 8/1999 | Manwaring |
| 5,938,266 A | | 8/1999 | Dauvergne et al. |
| 5,992,925 A | | 11/1999 | Alberici |
| 6,095,272 A | * | 8/2000 | Takiguchi et al. |
| 6,186,887 B1 | | 2/2001 | Dauvergne |
| 6,296,298 B1 | * | 10/2001 | Barz et al. |

FOREIGN PATENT DOCUMENTS

| | | |
|---|---|---|
| FR | 2 795 670 | 1/2001 |
| GB | 2 369 798 | 6/2002 |
| JP | 63056412 | 11/1988 |
| WO | 99/59225 | 11/1999 |
| WO | 00/70723 | 11/2000 |

OTHER PUBLICATIONS

Robert Florence and Kenneth Sherman, III, "Instrument Panel Trends And Engineering Thermoplastics", Automotive Engineering, Society of Automotive Engineers, vol. 105, No. 5, May 1, 1997, pp. 39–41, XP000689538.

\* cited by examiner

Primary Examiner—D. Glenn Dayoan
Assistant Examiner—Scott Carpenter
(74) Attorney, Agent, or Firm—MacMillan, Sobanski & Todd, LLC

(57) ABSTRACT

A method for supporting an electrical component in a vehicle includes providing an electrical component, selecting a vehicle component to be made at least in part of a flexible foam material, and producing the vehicle component such that the electrical component is embedded in the foam material of the vehicle component, thereby providing support for the electrical component.

16 Claims, 4 Drawing Sheets

METHOD AND APPARATUS FOR SUPPORTING AN ELECTRICAL CIRCUIT BOARD IN A VEHICLE PANEL CLOSURE

TECHNICAL FIELD

This invention relates to a closure for an opening in an interior vehicle panel.

More particularly, the invention relates to an end cap for a vehicle instrument panel.

BACKGROUND OF THE INVENTION

The front area of the interior of a vehicle, generally referred to as the cockpit area, includes an instrument panel, typically formed of a molded plastic material. The instrument panel typically includes an interior or cockpit facing surface and a hollow space opposite or behind the interior surface for concealing numerous housings, components, and connections between vehicle components, such as air conditioning systems, electrical systems, and electrical circuit boards. In some vehicles, the is housings, components, and connections are secured to a rear face of the instrument panel. In other vehicles the housings, components, and connections are secured to a front body panel of the vehicle. A problem with electrical components is that they can be susceptible to damage if they are mounted in such a way that they are subject to relatively large amounts of vibration. The instrument panel typically also includes left and right side access panels or end caps for providing access to the hollow space behind the cockpit facing surface of the instrument panel.

End caps are typically formed of rigid plastic, and can be made of the same material, color, and texture as the facing of the instrument panel visible to a vehicle occupant. Generally, fasteners such as metal clips are attached to an inner surface of each end cap by threaded fasteners, rivets, or glue. The left and right sides of the instrument panel are configured to receive the clips of the left and right side end caps, respectively, to hold each end cap in place. Such rigid plastic end caps, attached to the instrument panel with metal clips, are prone to vibrate during vehicle operation. Such vibration results in undesirable noise such as squeaks and rattles. Electrical components such as electrical circuit boards can often be secured to the rigid plastic access panels or end caps. The electrical components can be subjected to relatively large amounts of vibration as the end cap is caused to vibrate, leading to failure of the electrical component. The rigid plastic end caps are also likely to allow the transmission of unwanted and undesirable noise, such as squeaks and rattles caused by components, such as electrical circuit boards, housed within the hollow space of the instrument panel. Further, the rigid plastic end caps are likely to allow the transmission of unwanted and undesirable noise generated by blower fans and the like, also housed within the hollow space of the instrument panel.

It would be advantageous if there could be developed a closure for an opening in an interior vehicle panel, where the closure has sound dampening properties. It would also be advantageous if there could be developed a closure for an opening in an is interior vehicle panel, where the closure is easy to manufacture and convenient to install. It would also be advantageous if there could be developed improved apparatus for supporting electrical components, thereby reducing vibration thereof.

SUMMARY OF THE INVENTION

The above objects as well as other objects not specifically enumerated are achieved by a method for supporting an electrical component in a vehicle, the method comprising: providing an electrical component; selecting a vehicle component to be made at least in part of a flexible foam material; producing the vehicle component such that the electrical component is embedded in the foam material of the vehicle component, thereby providing support for the electrical component.

The above method is typically achieved by a closure for an opening in an interior vehicle panel, the closure constructed of flexible foam material having sound dampening properties. The flexible foam material further has a retaining structure integrally formed therein for retaining the closure to the interior vehicle panel.

Various objects and advantages of this invention will become apparent to those skilled in the art from the following detailed description of the preferred embodiment, when read in light of the accompanying drawings.

DETAILED DESCRIPTION OF THE INVENTION

Figure 1:
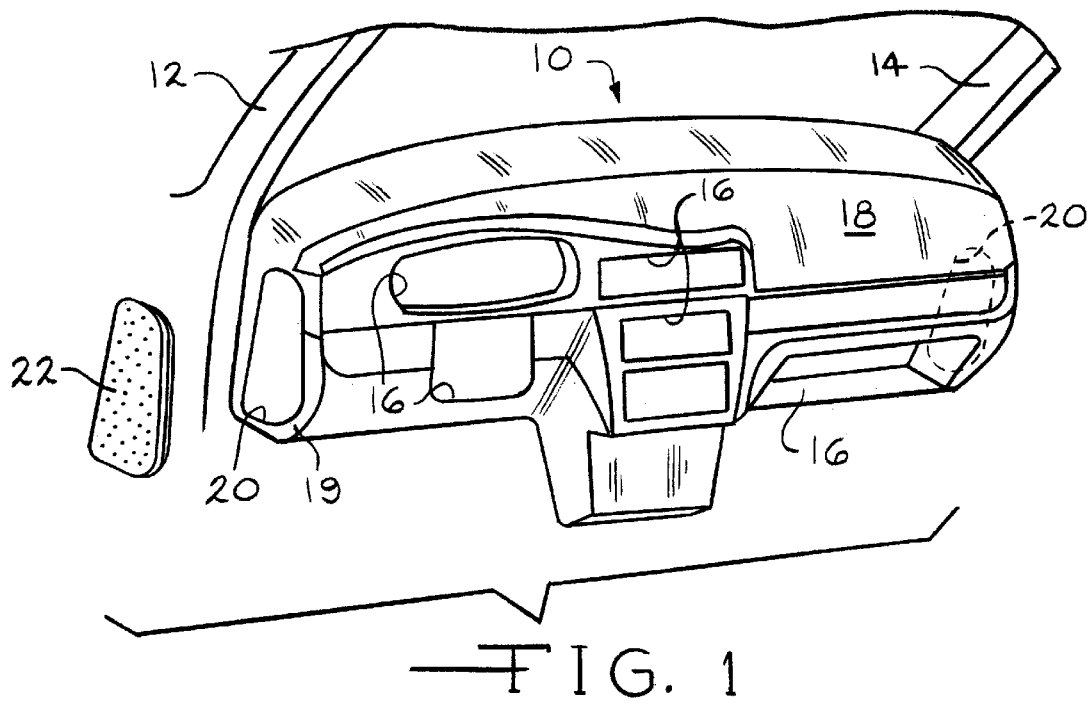
FIG. 1 is an exploded perspective view of a vehicle instrument panel illustrating an instrument panel end cap according to the invention.

As shown in FIG. 1, there is generally shown at 10 an instrument panel for a vehicle. The instrument panel 10 is positioned inside the body of a vehicle (not shown) at a forward portion of the vehicle commonly referred to as the cockpit. The instrument panel 10 generally extends laterally between windshield pillars 12 and 14 across the width of the interior of the vehicle. The instrument panel 10 includes a plurality of openings 16 suitable for permitting the integration of different accessories and/or internal components of the vehicle, such as openings for integrating a steering column (not shown), an instrument housing (not shown), a radio (not shown), and a glove compartment closure (not shown). The instrument panel 10 typically includes an interior or cockpit facing surface 18 and spaced apart outwardly facing side surfaces 19. The side surfaces 19 are commonly covered by door panels (not shown) when the vehicle door is closed. A hollow space (not numbered) is formed opposite the cockpit facing surface 18, and between the side surfaces 19, for concealing numerous housings, components, and/or connections between vehicle components.

The cockpit facing 18 surface also provides an esthetically pleasing appearance for the interior of the passenger compartment of the vehicle. The housings, components, and/or connections are typically secured to a rear face (not numbered) of the instrument panel 10, or to a front body panel (not shown) of the vehicle.

The instrument panel 10 also typically includes openings 20 in each side surface 19 for providing access to the components, such as air conditioning systems, heater fans, electrical systems, and electrical circuit boards concealed in the hollow space of the instrument panel 10.

Figure 2:
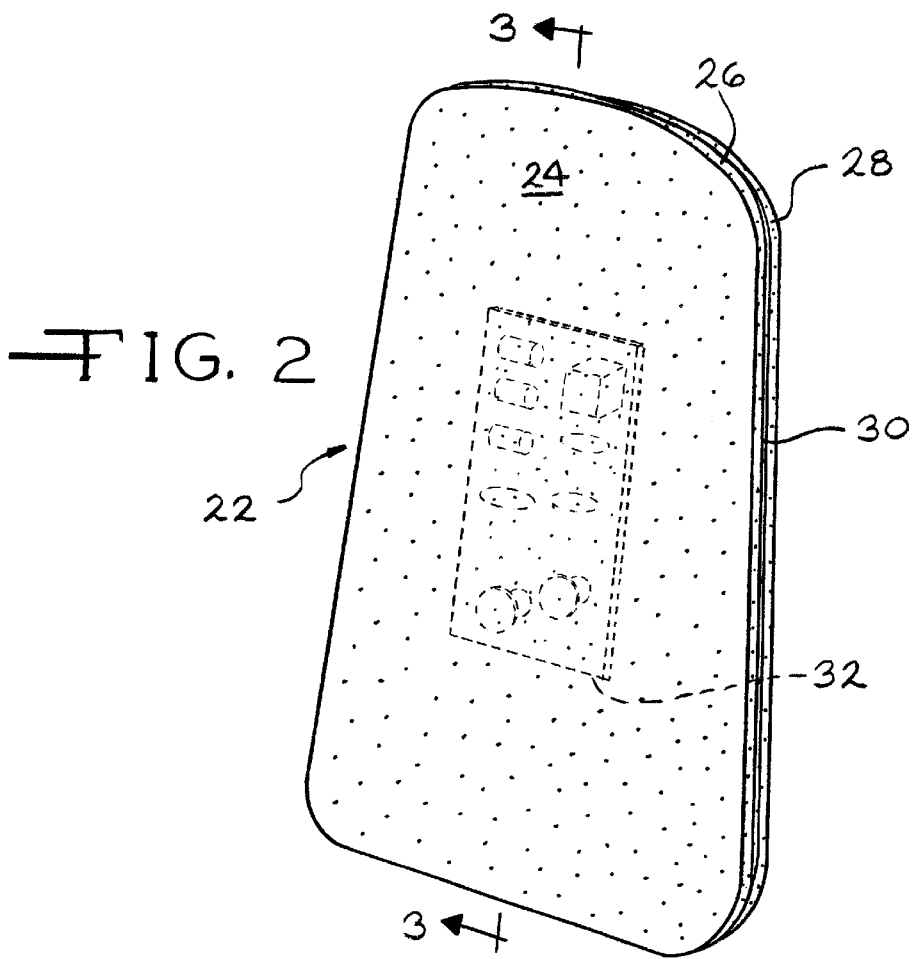
FIG. 2 is an enlarged perspective view of the end cap illustrated in FIG. 1.
Figure 3:
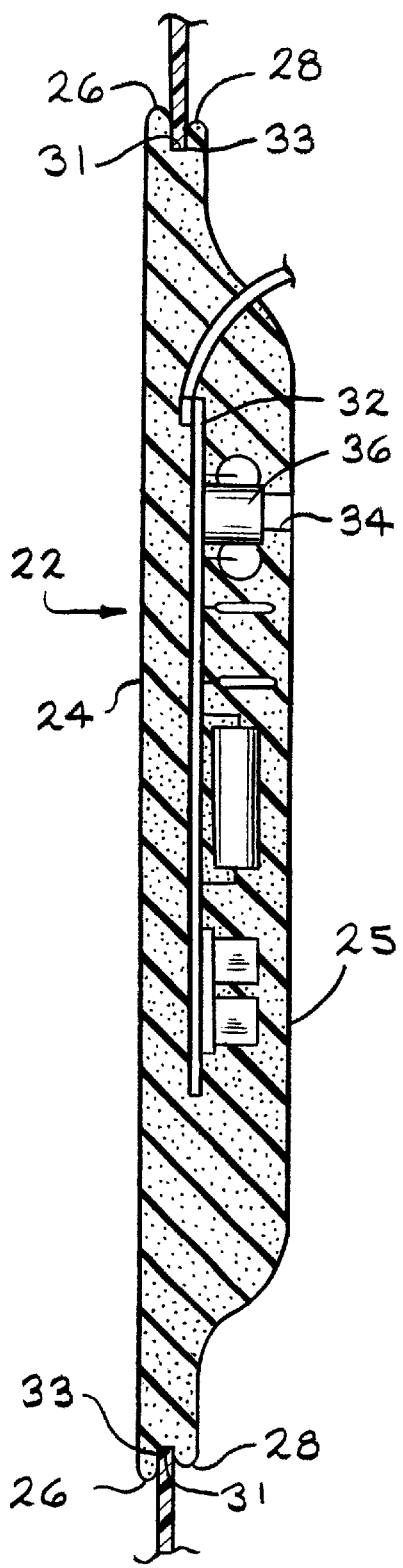
FIG. 3 is a cross-sectional elevational view of the end cap illustrated in FIGS. 1 and 2, taken along line 3—3 of FIG. 2.

A closure or end cap 22, as illustrated in FIGS. 2 and 3, is provided for enclosing each opening 20. The end cap 22 is preferably formed of a flexible, self-skinning foam material such as urethane. It will be understood that the expression self-skinning is intended to mean a material which allows the end cap 22 to be molded or formed so that a cockpit facing surface 24 thereof will have an aesthetically pleasing texture, color, and appearance such as the texture, color, and appearance of the cockpit facing surface 18 of the instrument panel 10. Typically, the desired color for the end cap 22 can be achieved by adding a dye or pigment to an uncured foam material prior to molding or forming the end cap 22, thereby eliminating the need to paint the cockpit facing surface 24 of the end cap 22. The flexible foam material further allows the end cap 22 to be flexed to facilitate insertion of the end cap 22 into the opening 20 of the instrument panel 10.

The end cap 22 further includes a second surface 25 opposite the cockpit facing surface 24, a cockpit facing circumferential edge 26, and a second circumferential edge 28 defining a circumferential groove 30 formed therein. A bottom surface 31 of the groove 30 corresponds to the shape and size of an edge or rim 33 of the opening 20 of the instrument panel 10, and facilitates the attachment of the end cap 22 to the instrument panel 10. The cockpit facing edge 26 and the second edge 28 also correspond to the shape of the opening 20; however, both the edge 26 and the edge 28 are larger than the opening 20. When properly attached to the instrument panel 10, the groove 30 of the end cap 22 will cause the end cap 22 to be retained on the rim 33 of the opening 20, as illustrated in FIG. 3. It is to be understood that the tongue and groove arrangement between the groove 30 of the end cap 22 and the rim 33 of the opening 20 can be reversed, with the edges 26, 28 of the end cap 22 forming a rim and the edges of the opening 20 having a groove for receiving the rim of the end cap 22. Although a closure or end cap 22 for an instrument panel 10 is illustrated, it will be understood that the closure may be a closure for any interior vehicle panel, such as a door panel.

The end cap 22 can have any suitable thickness, such as within the range of from about 1/16 inch to about 1/8 inch thick. It has been shown that an end cap 22 having such a thickness, and constructed of a flexible foam material, has desirable sound dampening properties. It will be understood however, that similar results may be achieved by an end cap 22 having a thickness larger than 1/8 inch, such as 1/4 inch or 1/2 inch thick. It will be further understood that the phrase sound dampening properties is intended to mean that the flexible foam material is beneficial in both stopping or retarding sound transmission from the hollow space of the instrument panel 10, and enhancing sound absorption by the end cap 22. The flexible foam material will thereby dampen or reduce the level of noise that typically emanates from components, such as heater/blower fans, contained within the hollow space of the instrument panel 10.

Figures 5, 6:
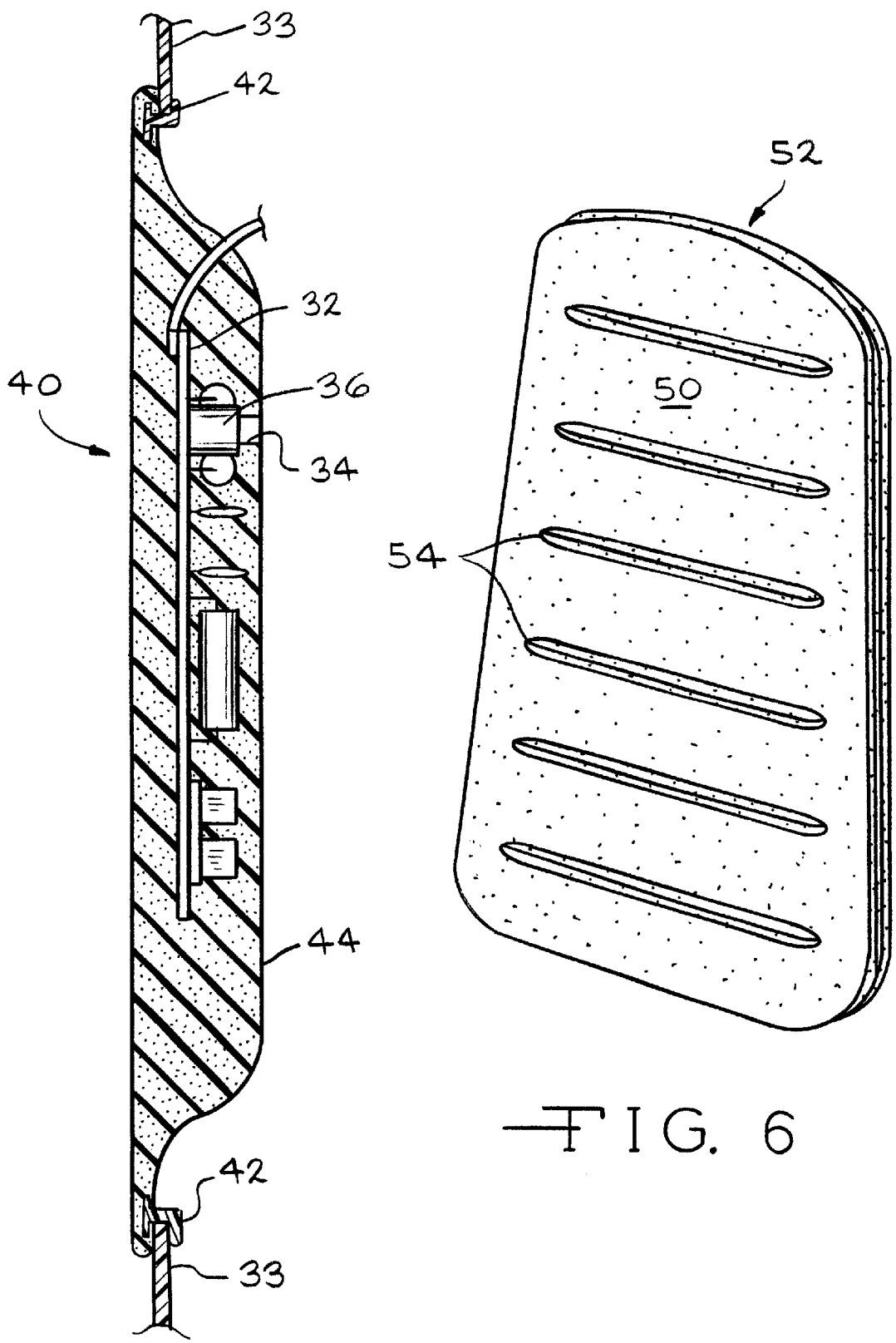
FIG. 5 is a cross-sectional elevational view of the end cap illustrated in FIG. 4, taken along line 5—5 of FIG. 4.
FIG. 6 is a perspective view of another embodiment of an end cap of the invention having a plurality of spaced apart parallel ribs.

The use of a flexible foam material for the end cap 22 provides an additional benefit of being able to retain and support an electrical circuit board 32, as illustrated in FIGS. 2, 3, and 5. The electrical circuit board 32 is preferably embedded within the end cap 22. The electrical circuit board 32 may be a circuit board for devices such as flasher units, chimes, bells, sensor units, and the like. It has been shown that by embedding and supporting a circuit board 32 in an end cap 22 formed from a flexible foam material, vibration, and the noise and damage caused by the vibration of the circuit board 32, are significantly lower than the vibration, noise, and damage caused by circuit boards within prior art instrument panels. It has been further shown that a closure formed from a foam material such as urethane results in a lower level of noise emanating from the hollow space of the instrument panel 10 than occurs with prior art closures.

As shown in FIG. 3, an access opening 34 is formed in the end cap 22 and extends from the second surface 25 to the circuit board 32. The access opening 34 provides access for adjustment, repair, or replacement of a portion of the circuit board 32, such a flasher unit 36. The access opening 34 may also facilitate ventilation of heat from heat producing portions of the circuit board 32. Although one access opening 34 is illustrated, it will be understood that satisfactory results may be achieved by an end cap 22 having no access openings, or an end cap 22 having more than one access opening.

The access opening 34 is preferably formed during molding of the end cap 22. Molding of the end cap 22 will typically be accomplished by a mold having two portions, one or both portions of the mold having pins on an inner surface thereof, the pins conforming to the desired number and shape of the access opening 34 to be formed. An uncured liquid foam material will be inserted into the mold having a cavity conforming to the desired shape of the end cap 22 to be formed, and thereafter cured. It will be understood, however, that similar results may be achieved by forming the access opening 34, after the end cap 22 has been cured and removed from the mold, by other means, such as, for example by cutting or drilling.

The end cap 22 illustrated is preferably formed of urethane. However, as appreciated by those skilled in the art, the end cap 22 may be fabricated of any flexible or semi-rigid foam material, or other suitable flexible, sound dampening material. Further, while mention has been made of the end cap 22 being entirely formed of a flexible foam material, it will be understood that similar results may be achieved by forming a portion of the end cap 22 from a flexible foam material and a portion, such as the cockpit facing surface 24, from another material, such as the plastic used to form the instrument panel 10, or other materials providing an esthetically pleasing appearance to the vehicle occupant. To achieve added strength and durability, it will also be understood that a surface 50 of the end cap 52 may include a reinforcing structure, such as a plurality of spaced apart parallel ribs 54, integrally formed integrally formed therein as illustrated in FIG. 6. The ribs 54 may also function as an energy absorbing structure in the event of a vehicle impact.

Figure 4:
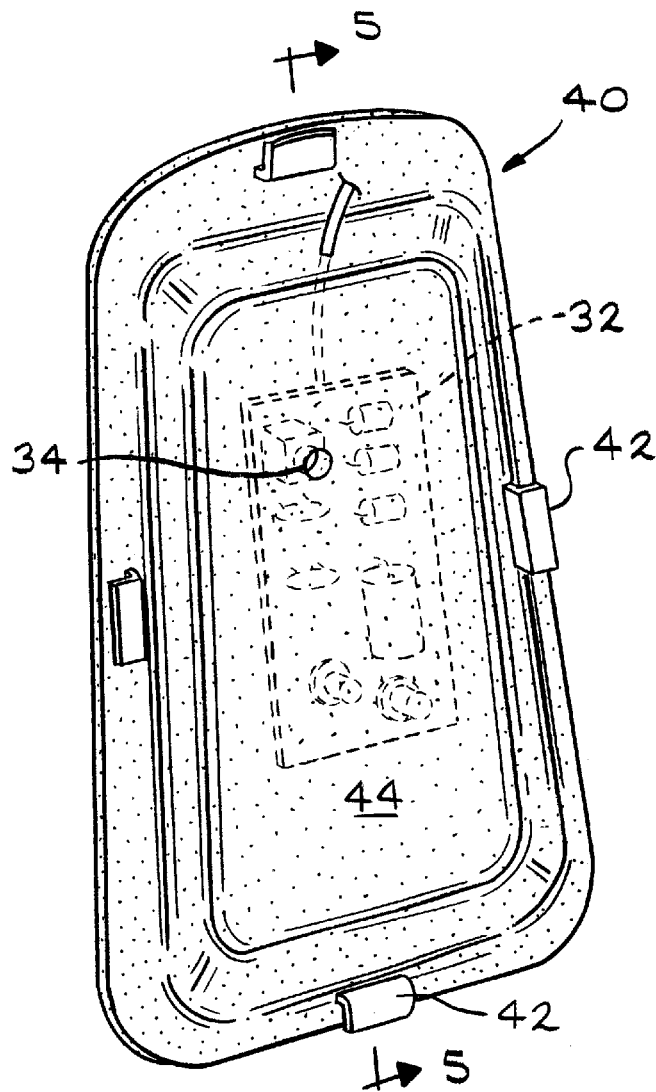
FIG. 4 is a perspective view of an alternate embodiment of an end cap according to the invention.

A further embodiment of the invention is illustrated in FIGS. 4 and 5 wherein an end cap 40 includes a plurality of integrally formed tabs 42 extending outwardly from a surface 44 of the end cap 40. The tabs 42 are configured to retain the end cap 40 in the opening 20 of the instrument panel 10, as illustrated in FIG. 5.

Although integrally formed retaining structures, such as grooves and tabs, are illustrated in FIGS. 2 to 5 inclusive, it will be understood that satisfactory results may also be achieved by a structure wherein the opening 20 of the side surface 19 includes any suitable integrally formed retaining structure adapted to receive an end cap 22 preferably having no such retaining structure.

Figure 7:
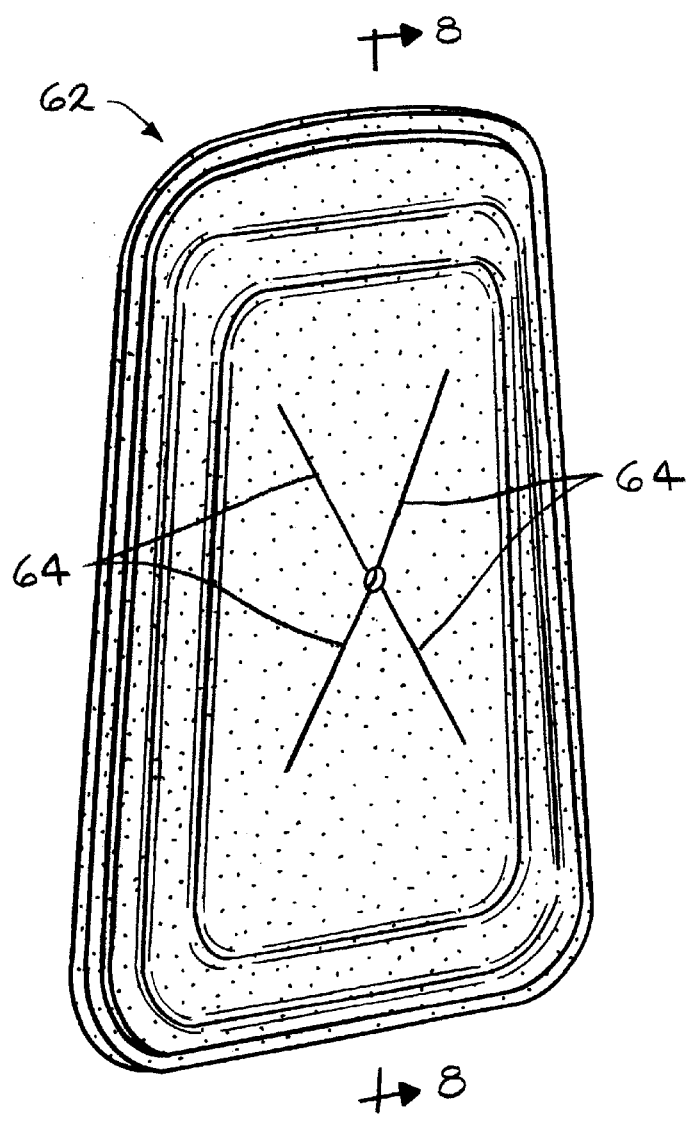
FIG. 7 is a perspective view of yet another embodiment of an end cap of the invention having an opening for receiving an electrical component.
Figure 8:
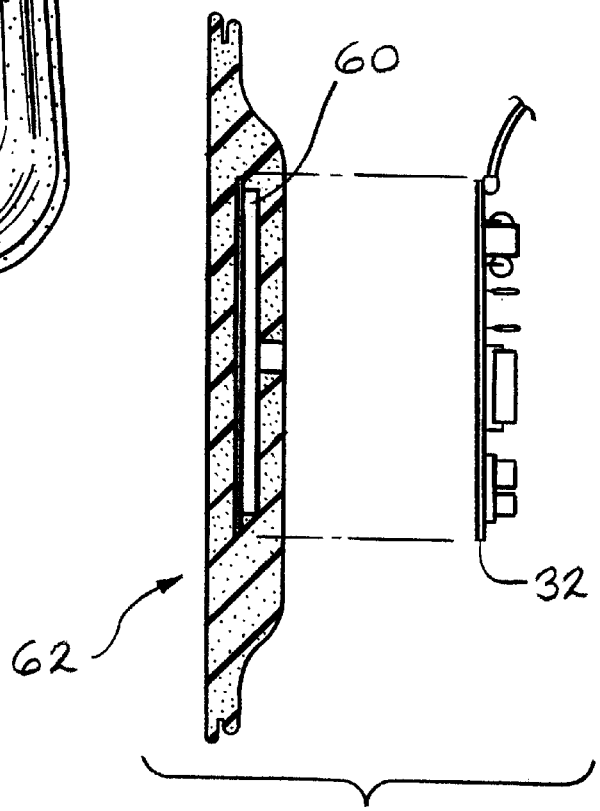
FIG. 8 is a cross-sectional elevational view of the end cap illustrated in FIG. 7, taken along line 8—8 of FIG. 7.

Another embodiment of the invention is illustrated in FIGS. 7 and 8 wherein the electrical circuit board 32 is embedded within a cavity 60 formed in an end cap 62. The cavity 60 is configured such that the electrical circuit board 32 can be readily inserted and removed from the cavity 60 through a slot or opening 64. It is therefore understood that the expression embedded as used herein is intended to mean completely enclosed within the foam material of the end cap 22 as illustrated in FIGS. 3 and 5, or partially enclosed within an end cap 62, as illustrated in FIGS. 7 and 8 to provide sufficient support.

It will be understood that although the invention is described in the context of a foam end cap for an instrument panel, the method of the invention can be achieved by selecting any vehicle component, such as a closure or an access panel for an access opening in a rear cargo area panel or a door panel, for example, to be made at least in part of a flexible foam material. It will be further understood that any such vehicle component can be produced having any electrical component, such as an electrical circuit board, embedded in the flexible foam material so as to retain and support the electrical component.

The invention is also described in the context of supporting an electrical component within a vehicle component, however it is to be understood that the method of the invention can be used to support an electrical component in other component configurations such as components for boats or appliances, for example.

The principle and mode of operation of this invention have been described in its preferred embodiments. However, it should be noted that this invention may be practiced otherwise than as specifically illustrated and described without departing from its scope.

What is claimed is:

1. A generally elongated vehicle instrument panel having an end with an opening formed therein, and having vehicle components mounted within the vehicle instrument panel, wherein the vehicle components transmit noise through the opening in the end, said vehicle instrument panel comprising:
    a closure for the opening in the end of the vehicle instrument panel, said closure constructed substantially of flexible foam material having sound dampening properties for reducing the noise transmitted through the opening in the end of the vehicle instrument panel; and
    an electrical circuit board substantially embedded in said closure.

2. The vehicle instrument panel according to claim 1, wherein said closure includes a retaining structure integrally formed therein, said retaining structure being constructed of flexible foam material such that said retaining structure can be flexed for selectively attaching and detaching said closure in said opening of said end.

3. The vehicle instrument panel according to claim 2, wherein said retaining structure comprises a groove formed in a peripheral edge of said closure.

4. The vehicle instrument panel according to claim 2, wherein said retaining structure includes at least one tab extending outwardly from a surface of said closure.

5. The vehicle instrument panel according to claim 1, wherein said flexible foam material is self-skinning foam.

6. The vehicle instrument panel according to claim 1, wherein said closure includes a plurality of generally parallel spaced apart strengthening ribs formed in a surface of said closure.

7. The vehicle instrument panel according to claim 1, wherein said circuit board has an electrical component mounted thereon, said circuit board being at least partially embedded in said foam material by a first portion of said foam material which covers at least a portion of said circuit board to support said circuit board within said foam material, wherein said first portion has an access opening formed therein and positioned adjacent said electrical component to provide access to said electrical component.

8. The vehicle instrument panel according to claim 1, wherein said circuit board is readily removable from said closure.

9. A vehicle component comprising:
    a flexible foam material; and
    an electrical circuit board having an electrical component mounted thereon, said circuit board at least partially embedded in said foam material by a first portion of said foam material which covers at least a portion of said circuit board to support said circuit board within said foam material, wherein said first portion has an access opening formed therein and positioned adjacent said electrical component to provide access to said electrical component, wherein said vehicle component is an end cap for an opening in an end of a vehicle instrument panel, and wherein said vehicle component includes a groove formed in a peripheral edge of said vehicle component, said groove for selectively attaching and detaching said vehicle component in said opening of the end of the instrument panel.

10. The vehicle component according to claim 9, said access opening permitting adjustment of said electrical component.

11. The vehicle component according to claim 9, said access opening permitting repair of said electrical component.

12. The vehicle component according to claim 9, said access opening permitting removal and replacement of said electrical component.

13. The vehicle component according to claim 9, wherein said flexible foam material is self-skinning foam.

14. The vehicle component according to claim 9, wherein said vehicle component includes a plurality of generally parallel spaced apart strengthening ribs formed in a surface of said vehicle component.

15. The vehicle component according to claim 9, wherein said circuit board is readily removable from said closure.

16. The vehicle component according to claim 9, wherein said vehicle component is mounted within said vehicle instrument panel, said vehicle component transmitting noise through said opening in said end, said foam material having sound dampening properties for reducing the noise transmitted through said opening in said end.

* * * * *